US009252229B2

(12) United States Patent
Ando et al.

(10) Patent No.: US 9,252,229 B2
(45) Date of Patent: Feb. 2, 2016

(54) INVERSION THICKNESS REDUCTION IN HIGH-K GATE STACKS FORMED BY REPLACEMENT GATE PROCESSES

(75) Inventors: Takashi Ando, Tuckahoe, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 13/605,267

(22) Filed: Sep. 6, 2012

(65) Prior Publication Data

US 2012/0326245 A1 Dec. 27, 2012

Related U.S. Application Data

(63) Continuation of application No. 13/100,371, filed on May 4, 2011, now abandoned.

(51) Int. Cl.
| | |
|---|---|
| *H01L 21/02* | (2006.01) |
| *H01L 29/49* | (2006.01) |
| *H01L 21/28* | (2006.01) |
| *H01L 29/51* | (2006.01) |
| *H01L 29/66* | (2006.01) |
| *H01L 29/78* | (2006.01) |

(52) U.S. Cl.
CPC ...... *H01L 29/4966* (2013.01); *H01L 21/28176* (2013.01); *H01L 29/517* (2013.01); *H01L 29/66606* (2013.01); *H01L 29/7833* (2013.01)

(58) Field of Classification Search
USPC ........................................................ 257/288
See application file for complete search history.

(56) References Cited

U.S. PATENT DOCUMENTS

| | | | |
|---|---|---|---|
| 6,432,777 B1 | 8/2002 | Rausch et al. | |
| 6,727,560 B1 | 4/2004 | Pan et al. | |
| 6,890,807 B2 | 5/2005 | Chau et al. | |
| 7,071,086 B2 | 7/2006 | Woo et al. | |
| 7,078,282 B2 | 7/2006 | Chau et al. | |
| 7,704,835 B2 | 4/2010 | Singh et al. | |
| 7,750,418 B2 | 7/2010 | Chudzik et al. | |
| 2004/0082125 A1 | 4/2004 | Hou et al. | |
| 2008/0242012 A1* | 10/2008 | Pae et al. | 438/197 |
| 2009/0023280 A1 | 1/2009 | Ang et al. | |

(Continued)

OTHER PUBLICATIONS

T. Ando et al., "Understanding Mobility Mechanisms in Extremely Scaled HfO2 (EOT 0.42 nm) Using Remote Interfacial Layer Scavenging Technique and Vt-tuning Dipoles with Gate-First Process", 2009 IEEE International Electron Devices Meeting (IEDM), Dec. 7-9, 2009, pp. 423-426.*

(Continued)

*Primary Examiner* — Andy Huynh
*Assistant Examiner* — Sitaramarao S Yechuri
(74) *Attorney, Agent, or Firm* — Cantor Colburn LLP; Vazken Alexanian

(57) ABSTRACT

A method of forming a transistor device includes forming an interfacial layer on a semiconductor substrate, corresponding to a region between formed doped source and drain regions in the substrate; forming a high dielectric constant (high-k) layer on the interfacial layer, the high-k layer having a dielectric constant greater than about 7.5; forming a doped metal layer on the high-k layer; performing a thermal process so as to cause the doped metal layer to scavenge oxygen atoms diffused from the interfacial layer such that a final thickness of the interfacial layer is less than about 5 angstroms (Å); and forming a metal gate material over the high-k dielectric layer.

5 Claims, 13 Drawing Sheets

(56) References Cited

U.S. PATENT DOCUMENTS

| | | | |
|---|---|---|---|
| 2009/0311877 | A1 | 12/2009 | Olsen et al. |
| 2010/0044806 | A1* | 2/2010 | Hou et al. ............... 257/412 |
| 2010/0320547 | A1 | 12/2010 | Ando et al. |

OTHER PUBLICATIONS

T. Ando et al., "Sub-1nm EOT HfSix/HfO2 Gate Stack Using Novel Si Extrusion Process for High Performance Application," 2006 Symposium on VLSI Technology, Digest of Technical Papers., 2006, pp. 166-167.

K. Choi et al., "Extremely Scaled Gate-First High-k/Metal Gate Stack with EOT of 0.55 nm Using Novel Interfacial Layer Scavenging Techniques for 22nm Technology Node and Beyond," 2009 Symposium on VLSI Technology, 2009, pp. 138-139.

P. Packan et al., "High Performance 32nm Logic Technology Featuring 2nd Generation High-k + Metal Gate Transistors," 2009 IEEE International Electron Devices Meeting (IEDM), Dec. 7-9, 2009, pp. 659-652.

J. Pan et al., "A Low-Temperature Metal-Doping Technique for Engineering the Gate Electrode of Replacement Metal Gate CMOS Transistors," IEEE Electron Device Letters, vol. 24, No. 9, Sep. 2003, pp. 547-549.

T. Ando et al., "Understanding Mobility Mechanisms in Extremely Scaled HfO2 (EOT 0.42 nm) Using Remote Interfacial Layer Scavenging Technique and Vt-tuning Dipoles with Gate-First Process," 2009 IEEE International Electron Devices Meeting (IEDM), Dec. 7-9, 2009, pp. 423-426.

Choi, "Aggressively scaled ultra thin undoped HfO2 gate dielectric (EOT <0.7 nm) with TaN gate electrode using engineered interface layer," IEEE Electron Device Letters, vol. 26, No. 7, Jul. 2005, pp. 454-457.

U.S. Appl. No. 13/100,371; Non-Final Office Action; Date Filed: May 4, 2011; Date of Mailing: Oct. 17, 2012; pp. 1-43.

Kim, "Engineering chemically abrupt high-k metal oxide/silicon interfaces using an oxygen-gettering metal overlayer," Journal of Applied Physics, vol. 96, No. 6, Sep. 2004, pp. 3467-3472.

J. Huang, et al., "Gate First High-k/Metal Gate Stacks with Zero SiOx Interface Achieving EOT=0.59nm for 16nm Application," VLSI Tech. Dig. Tech. Pap. 2009, pp. 34-35.

H Kim, et al., "Engineering chemically abrupt high-k metal oxide/silicon interfaces using an oxygen-gettering metal overlayer," J. Appl. Phys., vol. 96, No. 6, pp. 3467-3472, Sep. 2004.

WordPress, [online]; [retrieved on Jan. 21, 2013]; retrieved from the Internet http://scsong.wordpress.com/2010/03/10/gate-first-or-gate-last-technologists-debate-high-k-2010-03-10-154115-semiconductor-international/ David Lammers, "Gate First, or Gate Last: Technologists Debate High-k", 2010, pp. 1-7, 15:41:15 ; Semiconductor International.

L. Ragnarsson, et al., "Ultra Low-EOT (5 A) Gate-First and Gate-Last High Performance CMOS Achieved by Gate-Electrode Optimization," Tech. Dig. Int. Electron Device Meet. 2009, pp. 663-666.

Chang, et al., "Oxygen Diffusion in Tantalum Oxide Metal-Oxide-Metal Capacitor Structures," Mat. Res. Soc. Symp. Proc., vol. 574, Materials Research Society, 1999, pp. 329-334.

\* cited by examiner

INVERSION THICKNESS REDUCTION IN HIGH-K GATE STACKS FORMED BY REPLACEMENT GATE PROCESSES

CROSS-REFERENCE TO RELATED APPLICATION

This application is a continuation of U.S. patent application Ser. No. 13/100,371, filed May 4, 2011, the disclosure of which is incorporated by reference herein in its entirety.

BACKGROUND

The present invention relates generally to semiconductor device manufacturing and, more particularly, to methods and structures for achieving inversion thickness ($T_{inv}$) reduction in high-k gate stacks formed by replacement gate processes.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric.

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below a thickness of about 1.1 nm for the silicon oxide gate dielectric.

Accordingly, recent MOS and CMOS transistor scaling efforts have focused on high-k dielectric materials having dielectric constants greater than that of $SiO_2$ (e.g., greater than about 3.9). High-k dielectric materials can be formed in a thicker layer than scaled $SiO_2$, and yet still produce equivalent field effect performance. The relative electrical performance of such high-k dielectric materials is often expressed in terms equivalent oxide thickness (EOT), since the high-k material layer may be thicker, while still providing the equivalent electrical effect of a much thinner layer of $SiO_2$. Because the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY

In one aspect, a method of forming a transistor device includes forming an interfacial layer on a semiconductor substrate, corresponding to a region between formed doped source and drain regions in the substrate; forming a high dielectric constant (high-k) layer on the interfacial layer, the high-k layer having a dielectric constant greater than about 7.5; forming a doped metal layer on the high-k layer; performing a thermal process so as to cause the doped metal layer to scavenge oxygen atoms diffused from the interfacial layer such that a final thickness of the interfacial layer is less than about 5 angstroms (Å); and forming a metal gate material over the high-k dielectric layer.

In another aspect, a method of forming a transistor device includes forming a chemical oxide interfacial layer on a semiconductor substrate, corresponding to a region between formed doped source and drain regions in the substrate, and between preformed gate sidewall spacers in accordance with a replacement gate scheme; forming a high dielectric constant (high-k) layer over an interlevel dielectric layer, on sidewalls of the sidewall spacers, and on the chemical oxide interfacial layer, the high-k layer having a dielectric constant greater than about 7.5; forming a doped metal layer on the high-k layer; performing an anneal in an $H_2$ ambient environment, at a temperature range of about 400° C. to about 600° C., so as to cause the doped metal layer to scavenge oxygen atoms diffused from the chemical oxide interfacial layer interfacial layer such that a final thickness of the chemical oxide interfacial layer interfacial layer is less than about 5 angstroms (Å); and forming a metal gate material over the high-k dielectric layer, within a recess defined by removal of a dummy gate structure used to form the source and drain regions in the substrate.

In still another aspect, a method of forming a transistor device includes forming a chemical oxide interfacial layer on a semiconductor substrate, corresponding to a region between formed doped source and drain regions in the substrate, and between preformed gate sidewall spacers in accordance with a replacement gate scheme; forming a high dielectric constant (high-k) layer over an interlevel dielectric layer, on sidewalls of the sidewall spacers, and on the chemical oxide interfacial layer, the high-k layer having a dielectric constant greater than about 7.5; forming a doped metal layer on the high-k layer; forming a sacrificial layer over the doped metal layer, at a deposition temperature range of about 500° C. to about 600° C., so as to cause the doped metal layer to scavenge oxygen atoms diffused from the chemical oxide interfacial layer interfacial layer such that a final thickness of the chemical oxide interfacial layer interfacial layer is less than about 5 angstroms (Å); removing the sacrificial layer; and forming a metal gate material over the high-k dielectric layer, within a recess defined by removal of a dummy gate structure initially used to form the source and drain regions in the substrate.

In still another aspect, a transistor device includes an interfacial layer formed on a semiconductor substrate, corresponding to a region between doped source and drain regions in the substrate, the interfacial layer having a thickness less than about 5 angstroms (Å); a high dielectric constant (high-k) layer formed on the interfacial layer, the high-k layer having a dielectric constant greater than about 7.5, the high-k layer having vertical sidewalls abutting vertical sidewalls of gate sidewall spacers; and a metal gate material formed over the high-k dielectric layer.

BRIEF DESCRIPTION OF THE SEVERAL VIEWS OF THE DRAWINGS

Referring to the exemplary drawings wherein like elements are numbered alike in the several Figures:

FIGS. 1 through 8 are cross sectional views of an exemplary embodiment of a method of forming high-k gate stacks for an FET device by replacement gate processing, in which:

FIG. 1 illustrates the removal of a sacrificial dummy gate structure formed on a semiconductor substrate;

FIG. 2 illustrates the formation of an interfacial layer (IL) and high-k dielectric layer over the structure of FIG. 1;

FIG. 3 illustrates the formation of a doped metal layer and a sacrificial polysilicon layer over the structure of FIG. 2, resulting in scavenging of oxygen atoms from the IL;

FIG. 4 illustrates an optional rapid thermal anneal of the structure of FIG. 3 for IL passivation;

FIG. 5 illustrates the removal of the sacrificial polysilicon layer and the doped metal layer of the structure of FIG. 4;

FIG. 6 illustrates an optional anneal of the structure of FIG. 5 in an oxygen ambient so as to reduce gate leakage current;

FIG. 7 illustrates the formation of a metal gate electrode material over the structure of 5;

FIG. 8 illustrates planarization of the structure of FIG. 7 so as to define a high-k, metal gate transistor structure;

FIGS. 9 through 11 are cross sectional views of another exemplary embodiment of a method of forming high-k gate stacks for an FET device by replacement gate processing, in which:

FIG. 9 illustrates the removal of only the sacrificial polysilicon layer of the structure of FIG. 4, leaving the doped metal layer;

FIG. 10 illustrates the formation of a metal gate electrode material over the structure of 9;

FIG. 11 illustrates planarization of the structure of FIG. 10 so as to define a high-k, metal gate transistor structure;

FIGS. 12 and 13 are cross sectional views of another exemplary embodiment of a method of forming high-k gate stacks for an FET device by replacement gate processing, in which:

FIG. 12 illustrates the formation of an interfacial layer (IL), a high-k dielectric layer, and a doped metal layer over the structure of FIG. 1; and FIG. 13 illustrates an anneal of the structure of FIG. 11, resulting in scavenging of oxygen atoms from the IL.

DETAILED DESCRIPTION

For a high performance CMOS device, the inversion capacitance-based oxide equivalent thickness, also referred to simply as "inversion thickness" ($T_{inv}$), of gate dielectrics should be scaled down below about 11 angstroms (Å) for future technologies. $T_{inv}$ measures the incremental inversion charge density per gate voltage swing. Due to inversion layer quantization and polysilicon gate depletion effects, $T_{inv}$ is thicker than EOT. As such, scaling of EOT also results in scaling of $T_{inv}$. One technique for reducing EOT is referred to as interfacial layer (IL) scavenging, in which a metal scavenging layer present in the gate stack captures oxygen atoms that diffuse, during high temperature annealing, from a bottom interface layer formed between the semiconductor substrate and the high-k dielectric layer. While such a technique is promising with respect to "gate first" high-k gate processes, $T_{inv}$ scaling has not heretofore been reported for high-k gate stacks fabricated by replacement gate processes.

A replacement gate process architecture avoids the problems of work function material stability seen in the gate first architecture. Here, a dummy gate structure is used to self-align the source and drain implant and anneals, followed by stripping out the dummy gate materials and replacing them with the high-k and metal gate materials. Although this process is more complex than a gate first technique, advantages of a replacement gate flow include the use of separate PMOS and NMOS metals for work function optimization. In addition, the two metals are not exposed to high temperatures, simplifying material selection. Further, the polysilicon gate removal can actually be used to enhance strain techniques, thereby increasing drive currents.

Accordingly, it is desirable to be able to apply the benefits of IL scavenging to high-k gate replacement process flows. Existing IL scavenging techniques for gate first process flows are typically performed at relatively high temperatures (e.g., on the order of about 1000° C.). However, since such elevated processing temperatures may have adverse effects on structures such as completed source/drain regions, conventional IL scavenging for gate replacement IL and high-K layers may be prove problematic since the source and drain regions are defined at this point. As described in further detail herein, it has been recognized that processing temperatures as low as about 400° C.-600° C. can facilitate effective IL scavenging, given certain other processing conditions.

Figure 1:
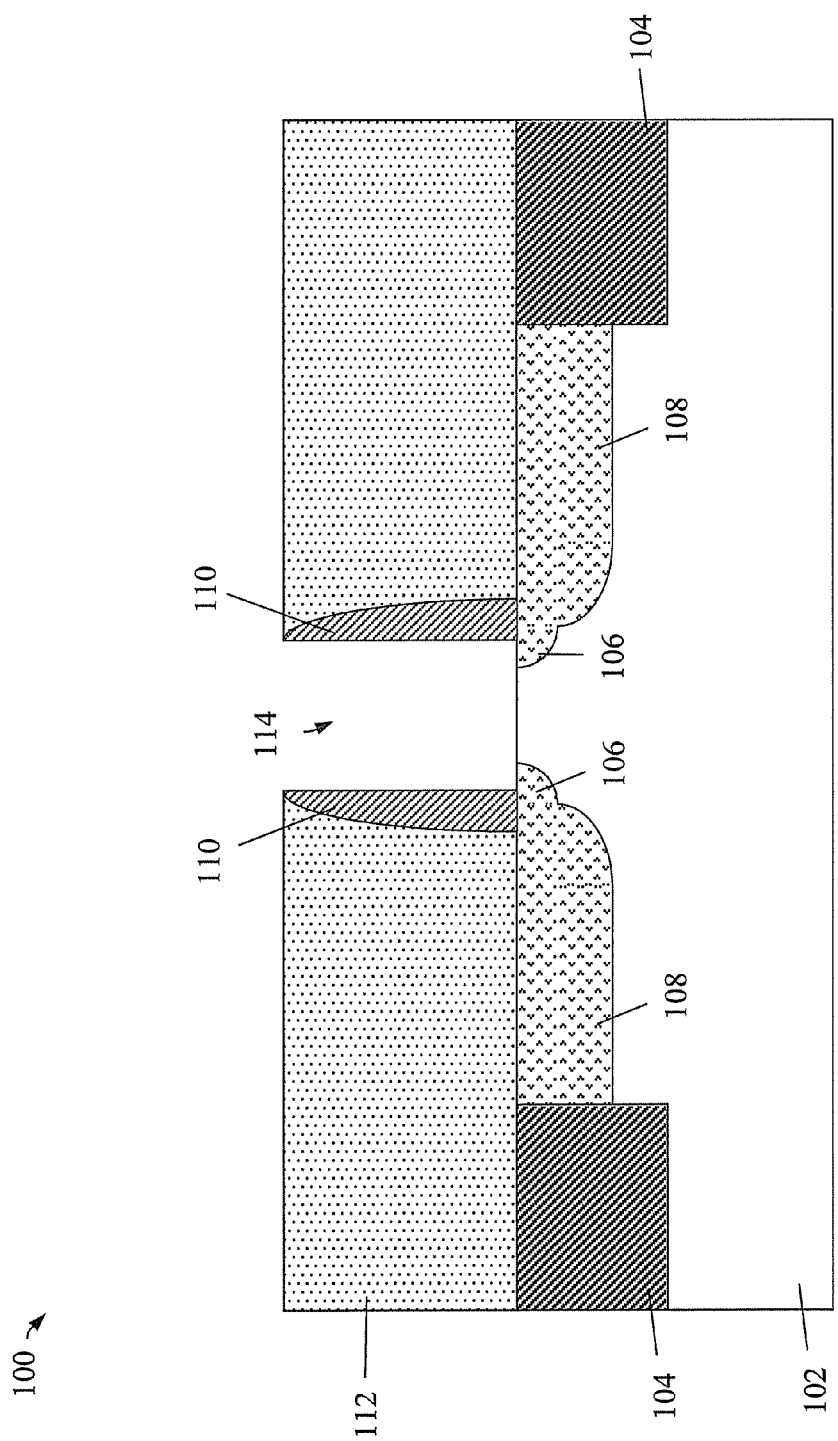

Referring initially to FIGS. 1 through 8, there is shown a series of cross sectional views of an exemplary embodiment of a method of forming a high-k gate stack for an FET device. As shown in FIG. 1, a semiconductor structure 100 includes a semiconductor substrate 102 having shallow trench isolation structures 104 formed therein. The semiconductor substrate 102 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Where the semiconductor material of the semiconductor substrate 102 is a single crystalline silicon-containing semiconductor material, the single crystalline silicon-containing semiconductor material may be selected from single crystalline silicon, a single crystalline silicon carbon alloy, a single crystalline silicon germanium alloy, and a single crystalline silicon germanium carbon alloy.

The semiconductor material of the semiconductor substrate 102 may be appropriately doped either with p-type dopant atoms or with n-type dopant atoms. The dopant concentration of the semiconductor substrate 102 may range from about $1.0 \times 10^{15}$ atoms/cm$^3$ to about $1.0 \times 10^{19}$ atoms/cm$^3$, and more specifically from about $1.0 \times 10^{16}$ atoms/cm$^3$ to about $3.0 \times 10^{18}$ atoms/cm$^3$, although lesser and greater dopant concentrations are contemplated herein also. In addition, the semiconductor substrate 102 may be a bulk substrate, a semiconductor-on-insulator or silicon-on-insulator (SOI)

substrate, or a hybrid substrate. The shallow trench isolation structures 104 include a dielectric material such as silicon oxide or silicon nitride, and are formed by methods well known in the art.

As also illustrated in FIG. 1, the semiconductor structure 100 is an example of replacement gate FET technology. Thus, the device includes source and drain extension regions 106 formed by ion implantation with a dummy gate structure (not shown) in place. The source and drain extension regions 106 have a doping of the opposite conductivity type of the doping of the substrate 102. For example, if the substrate 102 has a p-type doping, the source and drain extension regions 106 have an n-type doping, and vice versa. Source and drain regions 108 are also depicted in FIG. 1, which are formed, for example, by ion implantation of the same conductivity type as the extension regions 106. The source and drain regions 108 are implanted with the dummy gate structure and sidewall spacers 110 in place. The sidewall spacers 110 are formed, for example, by deposition of a conformal dielectric material layer (e.g., and oxygen-impermeable material such as silicon nitride) followed by an anisotropic ion etching. The portions of the dielectric material layer that are formed directly on the sidewalls of the dummy gate structure remain after the anisotropic etch to constitute the sidewall spacers 110.

Prior to removal of the dummy gate structure, an interlevel dielectric (ILD) layer 112 is formed over top surfaces the device. The ILD layer 112 includes a dielectric material such as silicon oxide, silicon nitride, silicon oxynitride, or a combination thereof. Alternatively, the ILD layer 112 may include a low-k dielectric material having a dielectric constant less than 3.9 (e.g., the dielectric constant of silicon oxide), and more specifically less than 2.5. Exemplary low-k dielectric materials include organosilicate glass (OSG) and SiLK®. The ILD layer 112 is planarized to expose a top surface of the dummy gate structure.

In accordance with a replacement gate process, FIG. 1 shows the dummy gate structure being removed, such as through one or more etch processes, so as to form a recess 114 that exposes a top surface of the substrate 102 corresponding to the location of the FET channel.

Figure 2:
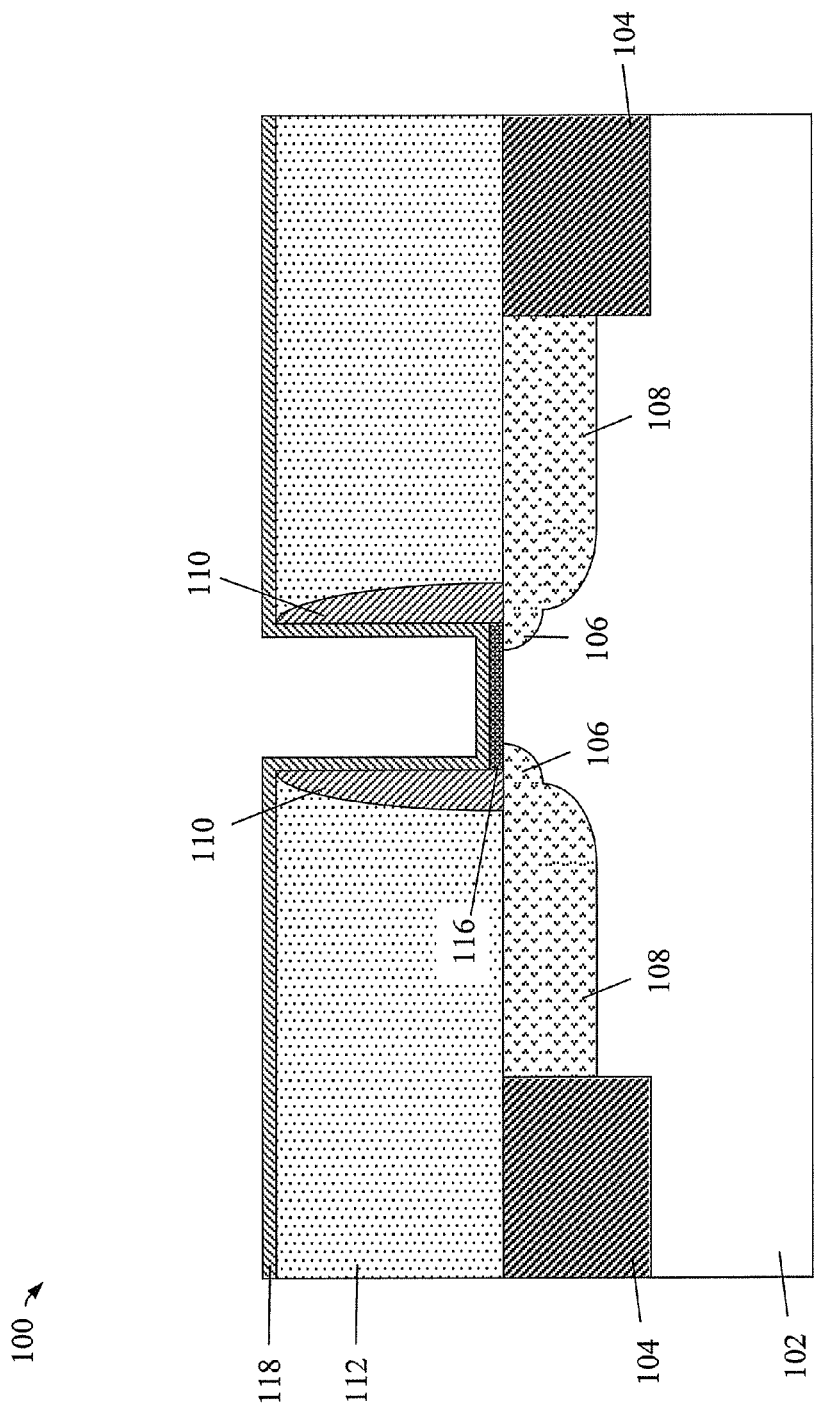

As then shown in FIG. 2, an interfacial oxide layer (IL) 116 is formed on the exposed semiconductor surface of the substrate 102 between the gate sidewall spacers 110. In an exemplary embodiment, the IL 116 is formed by a chemical oxide process such as by a wet chemical oxidation that includes treating the cleaned semiconductor surface 102 (e.g., by hydrofluoric acid) with a mixture of ammonium hydroxide, hydrogen peroxide and water (in a 1:1:5 ratio) at 65° C. Alternatively, the chemical oxide layer can also be formed by treating the HF-last semiconductor surface in ozonated aqueous solutions, with the ozone concentration usually varying from, but not limited to: 2 parts per million (ppm) to 40 ppm. However, it will be appreciated that the IL layer 116 may be formed by other processes known in the art such as, for example, by atomic layer deposition (ALD) of $SiO_2$ or by rapid thermal anneal (RTA) in an $O_2$ or $NH_3$ ambient environment. The formation of the IL 116 allows for nucleation of a high-k dielectric layer 118 formed thereon, which includes a dielectric metal oxide having a dielectric constant that is greater than the dielectric constant (7.5) of silicon nitride.

The high-k dielectric layer 118 may be formed by methods well known in the art including, for example, chemical vapor deposition (CVD), ALD, molecular beam deposition (MBD), pulsed laser deposition (PLD), liquid source misted chemical deposition (LSMCD), etc. In an exemplary embodiment, the dielectric metal oxide of the high-k dielectric layer 118 includes a metal and oxygen, and optionally nitrogen and/or silicon. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 118 may be from about 1 nm to about 10 nm, and more specifically from about 1.5 nm to about 3 nm.

Figure 3:
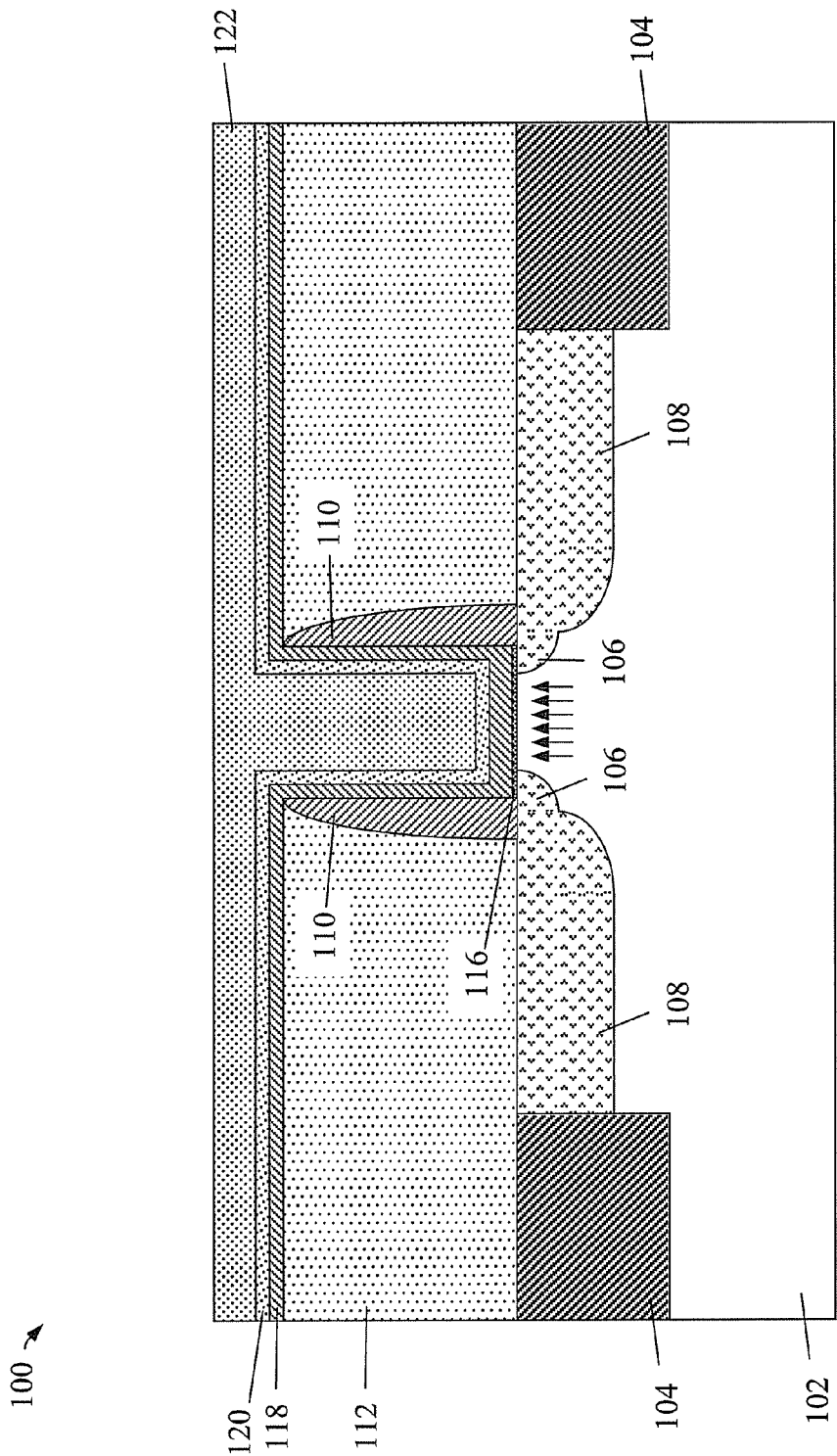

As indicated above, the thickness of the IL 116 limits scaling of the EOT and $T_{inv}$ of the composite dielectric stack 116/118. Accordingly, FIG. 3 illustrates the formation a doped metal layer 120 over the high-k dielectric layer 118. The doped metal layer 120, while depicted as a single layer for illustrative purposes, may further include first and second metallic compound layers that surround a scavenging metal layer. The material of the first and second metallic compound layers may include a conductive transition metal nitride or a conductive transition metal carbide. For example, the metallic compound layers may be selected from the group of TiN, TiC, TaN, TaC, and combinations thereof. As used herein, transition metals include elements from Group 3B, 4B, 5B, 6B, 7B, 8B, 1B, and 2B and lanthanides and actinides in the periodic table of elements. In one example, the first metallic compound layer and the second metallic compound layer are the same material. In another case, the first metal compound layer and the second metal compound layer are different materials.

The scavenging metal layer portion of the doped metal layer 120 is selected so as to "scavenge" impurity oxygen from neighboring metallic layers during subsequent processing, and may include a metal such as, but not limited to: Al, Be, Mg, Ca, Sr, Ba, Sc, Y, La, Ti, Zr, Hf, Dy, Lu, Er, Pr, and Ce. In one embodiment, the scavenging metal layer portion of the doped metal layer 120 includes at least one alkaline earth metal. In another embodiment, the scavenging metal layer portion of the doped metal layer 120 includes at least one transition metal. In yet another embodiment, the scavenging metal layer portion of the doped metal layer 120 includes a mixture of at least one alkaline earth metal and at least one transition metal.

In one specific embodiment, the material for the scavenging metal layer portion of the doped metal layer 120 is selected such that the Gibbs free energy change of a chemical reaction, in which an atom constituting a channel combines with a metal oxide material including the doped metal and oxygen to form the doped metal in elemental form and oxide of the atom constituting the channel, is positive. Because titanium (Ti) has a more negative Gibbs free energy per oxygen atom for formation of an oxide than, for example, tantalum (Ta), one particularly advantageous choice for the material of the first and second metallic compound layers of the doped metal layer 120 is Ti-rich TiN. A particular advantageous choice for the scavenging metal layer portion of the doped metal layer 120 is an aluminum layer including aluminum in elemental metal form. Thus, one exemplary embodiment of the doped metal layer 120 is TiN/Al/TiN.

Figure 4:
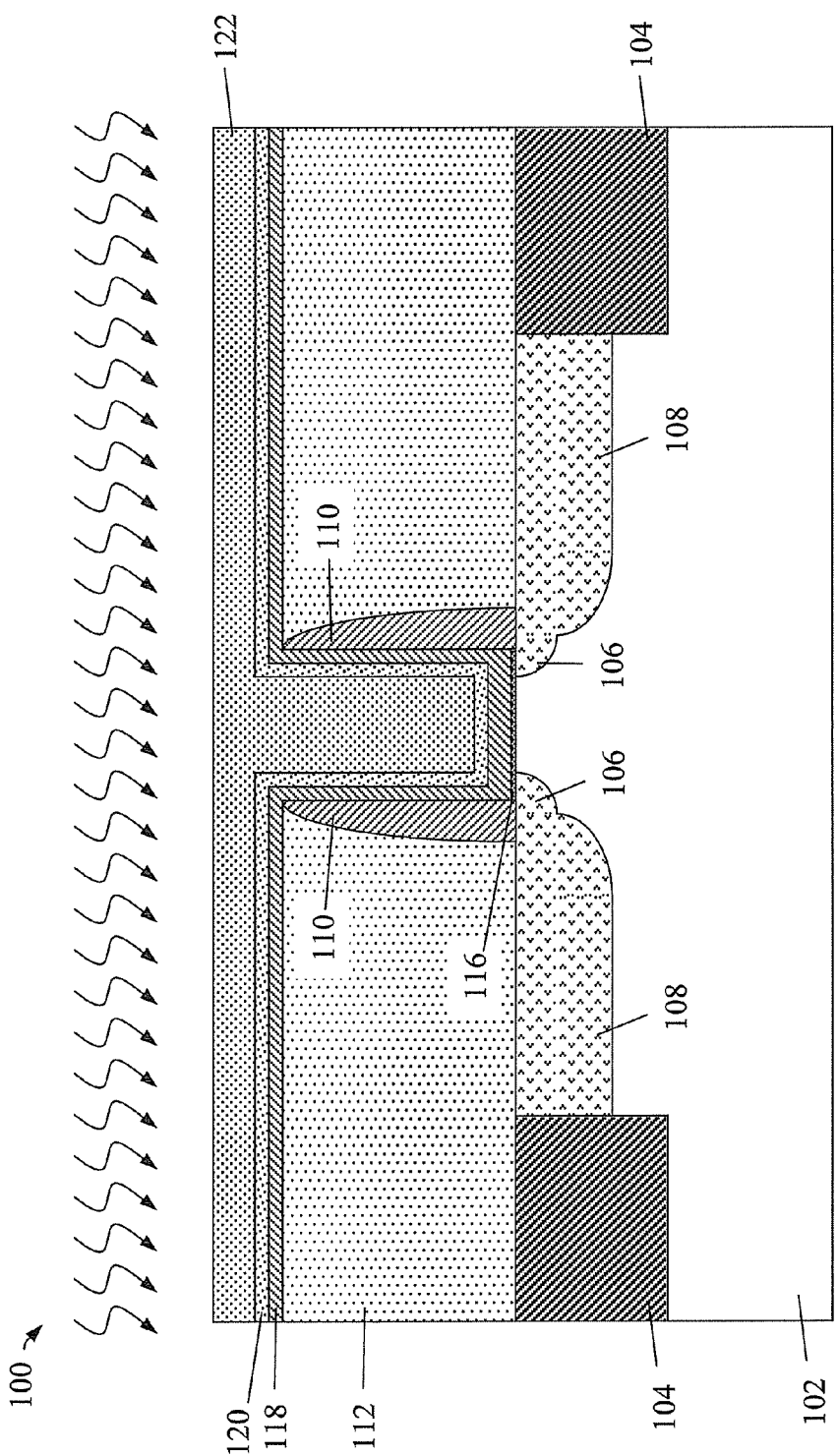

In order to initiate oxygen scavenging in the embodiment of FIG. 3, a sacrificial layer 122, such as amorphous or polycrystalline silicon, for example, is formed over the doped metal layer 120 by CVD. The process by which the sacrificial layer is formed initiates, in this embodiment, IL scavenging of oxygen atoms. Previously, IL scavenging was performed at elevated temperatures of about 1000° C., which has heretofore limited the scavenging to gate first process flows. However, by performing the sacrificial layer at a deposition temperature of about 500° C. to about 600° C., scavenging of the IL 116 takes place as illustrated by the upward arrows in FIG. 3. In addition, it will be noted that the scavenging doped metal layer 120 actively reduces the thickness of the IL 116 underneath. With the sacrificial layer still 122 in place, FIG. 4 illustrates an optional RTA of the structure of FIG. 3 for IL passivation following the scavenging. The RTA (depicted by the curved arrows) in FIG. 4, may be performed at a temperature of about 700° C. to about 1000° C., and may also include a flash or millisecond range laser anneal. The RTA also helps to improve the reliability of the high-k dielectric layer 118.

Figure 5:
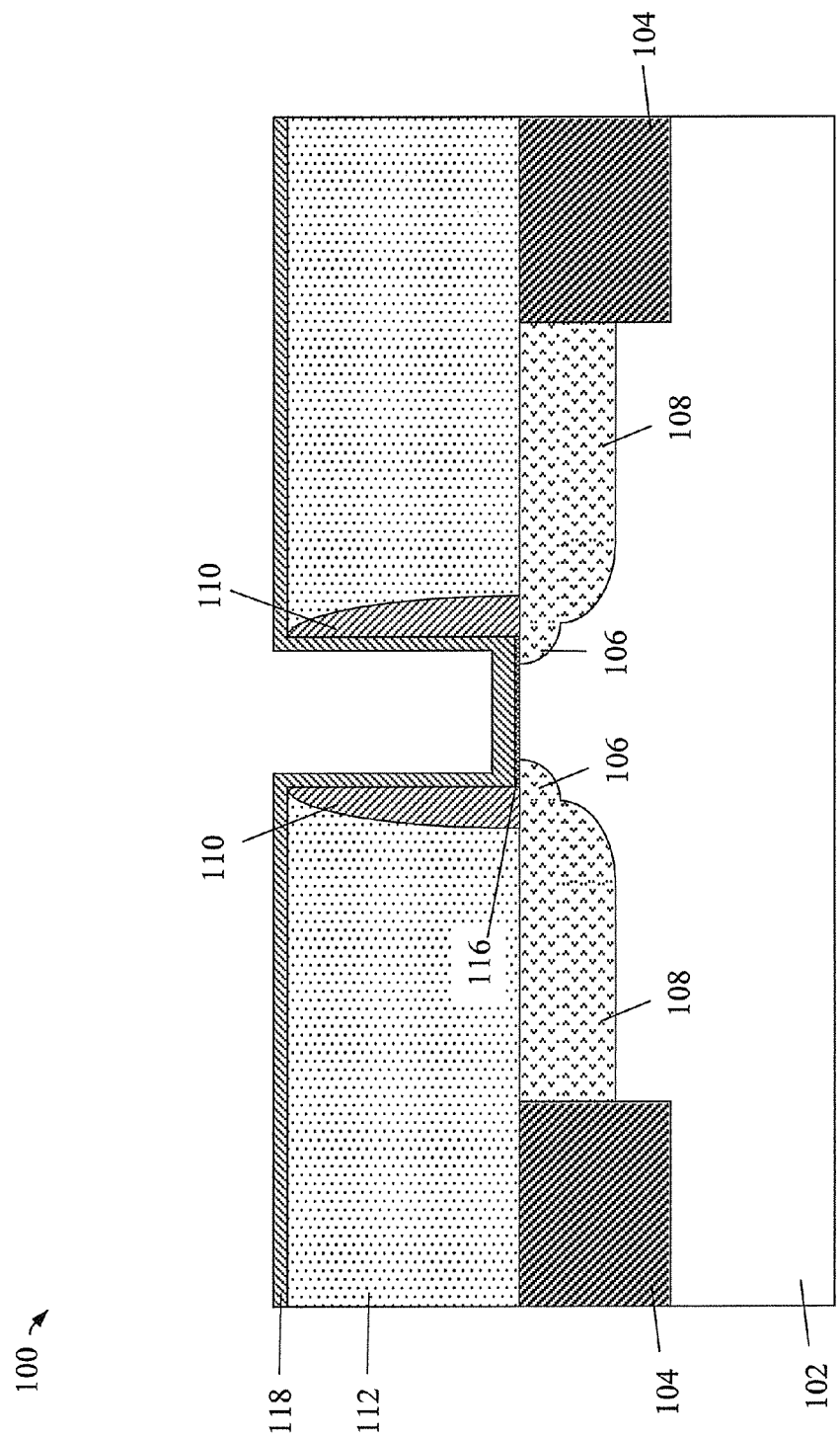
Figure 6:
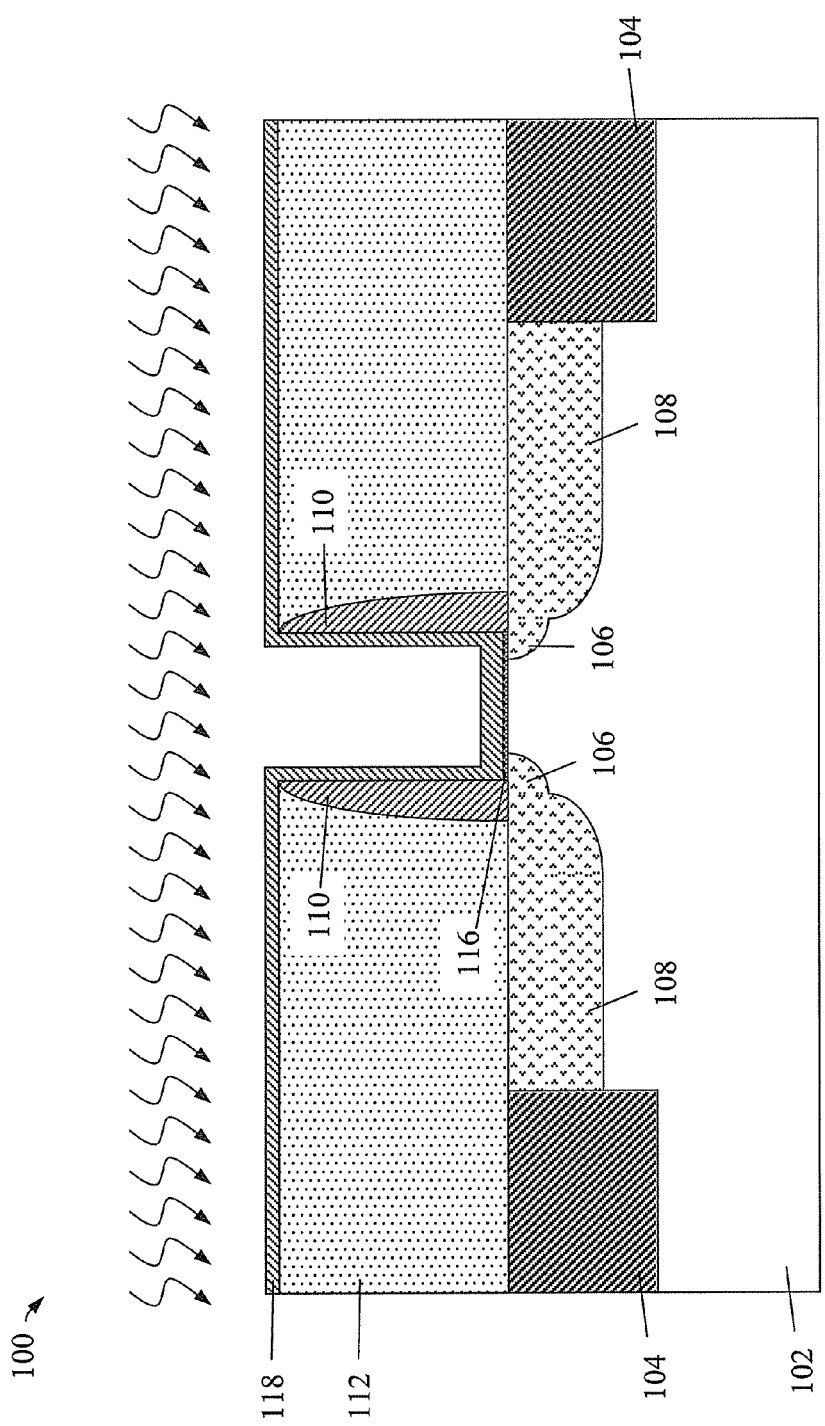

Referring now to FIG. 5, the sacrificial layer 122 is removed in preparation of metal gate electrode formation. In this embodiment, the doped metal layer 120 is also removed. Following the removal of the doped metal layer 120, FIG. 6 illustrates an optional anneal of the structure of FIG. 5 in an oxygen ambient so as to reduce gate leakage current. In an exemplary embodiment, this optional post scavenging anneal is performed at a temperature of about 350° C. to about 450° C.

Figure 7:
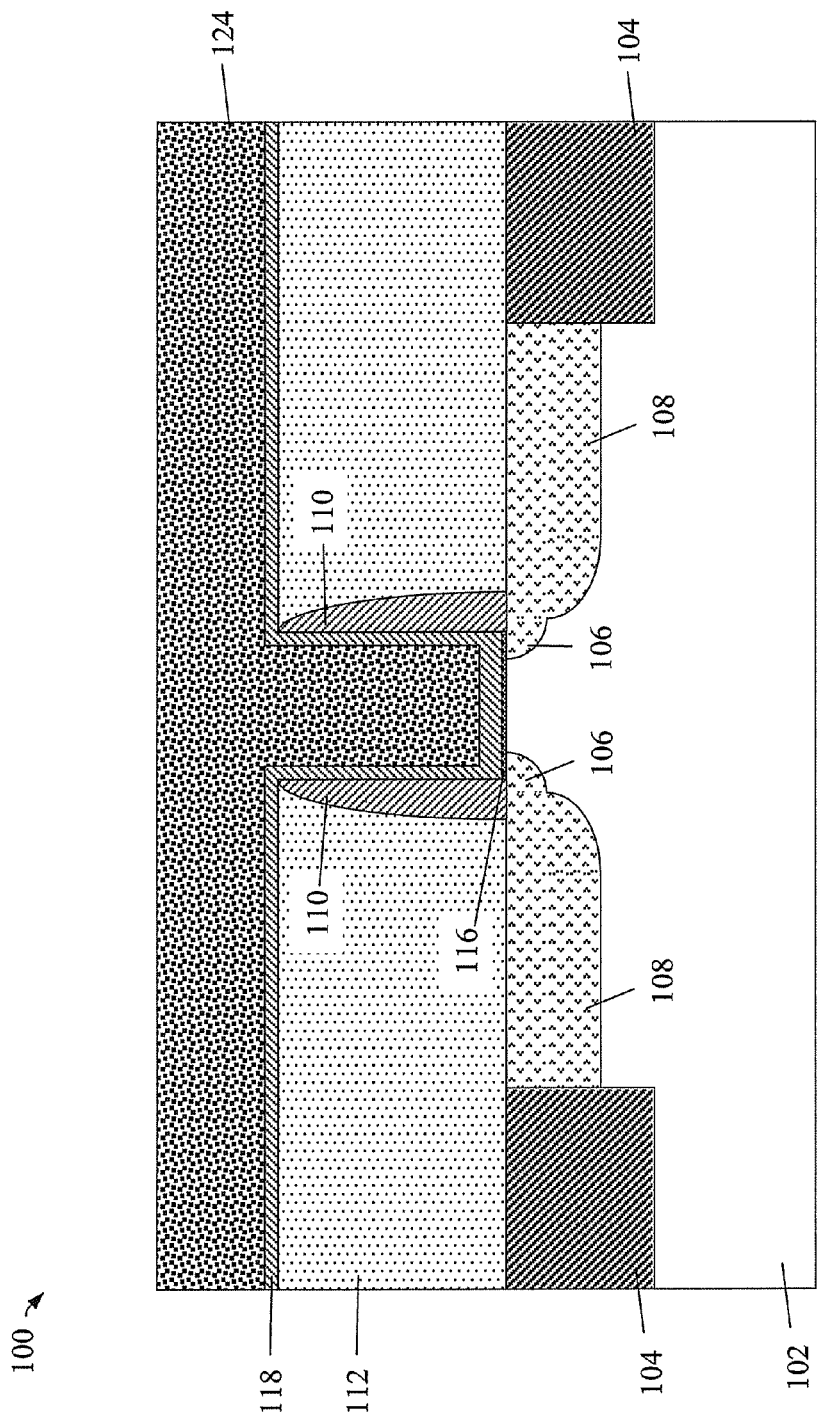

Then, as shown in FIG. 7, a metal gate material stack generally designated by 124 is formed over the structure, into the recess created by removal of the sacrificial layer 122 and doped metal layer 120. The metal gate material stack 124 may include one or more layers of metal materials such as, for example, Al, Ta, TaN, W, WN, Ti and TIN, having an appropriate workfunction depending on whether the transistor is an NFET or a PFET device.

In one specific embodiment of an NFET device, the metal gate material stack 124 includes workfunction setting metal layers selected to set the workfunction around the silicon conduction band edge. Such workfunction setting metal layers may include, for example, optional layers of about 10 Å to about 30 Å thick titanium nitride and about 10 Å to about 30 Å thick tantalum nitride, followed by a non-optional about 10 Å to about 40 Å thick layer of titanium aluminum, which together make up a workfunction setting metal layer portion of the metal gate material stack 124. Alternatively, titanium aluminum nitride, tantalum aluminum, tantalum aluminum nitride, hafnium silicon alloy, hafnium nitride, or tantalum carbide may be used in the workfunction setting metal layer portion in lieu of the titanium aluminum.

In one specific embodiment of a PFET device, the metal gate material stack 124 includes workfunction setting metal layers selected to set the workfunction around the silicon valence band edge. Here, such workfunction setting metal layers may include, for example, optional layers of about 10 Å to about 30 Å thick titanium nitride and about 10 Å to about 30 Å thick tantalum nitride, followed by non-optional layers of about 30 Å to about 70 Å thick titanium nitride and about 10 Å to about 40 Å thick layer of titanium aluminum, which together make up a workfunction setting metal layer portion of the metal gate material stack 124. Alternatively, tungsten, tantalum nitride, ruthenium, platinum, rhenium, iridium, or palladium may be used in the workfunction setting metal layer portion in lieu of the titanium nitride and titanium aluminum nitride, tantalum aluminum, tantalum aluminum nitride, hafnium silicon alloy, hafnium nitride, or tantalum carbide may be deposited instead of the titanium aluminum.

Regardless of the specific workfunction setting metal layers used in either an NFET or a PFET device, the remainder of the metal gate material stack 124 may include a fill metal such as aluminum, titanium-doped aluminum, tungsten or copper to result in the metal gate material stack 124 shown in FIG. 7.

Figure 8:
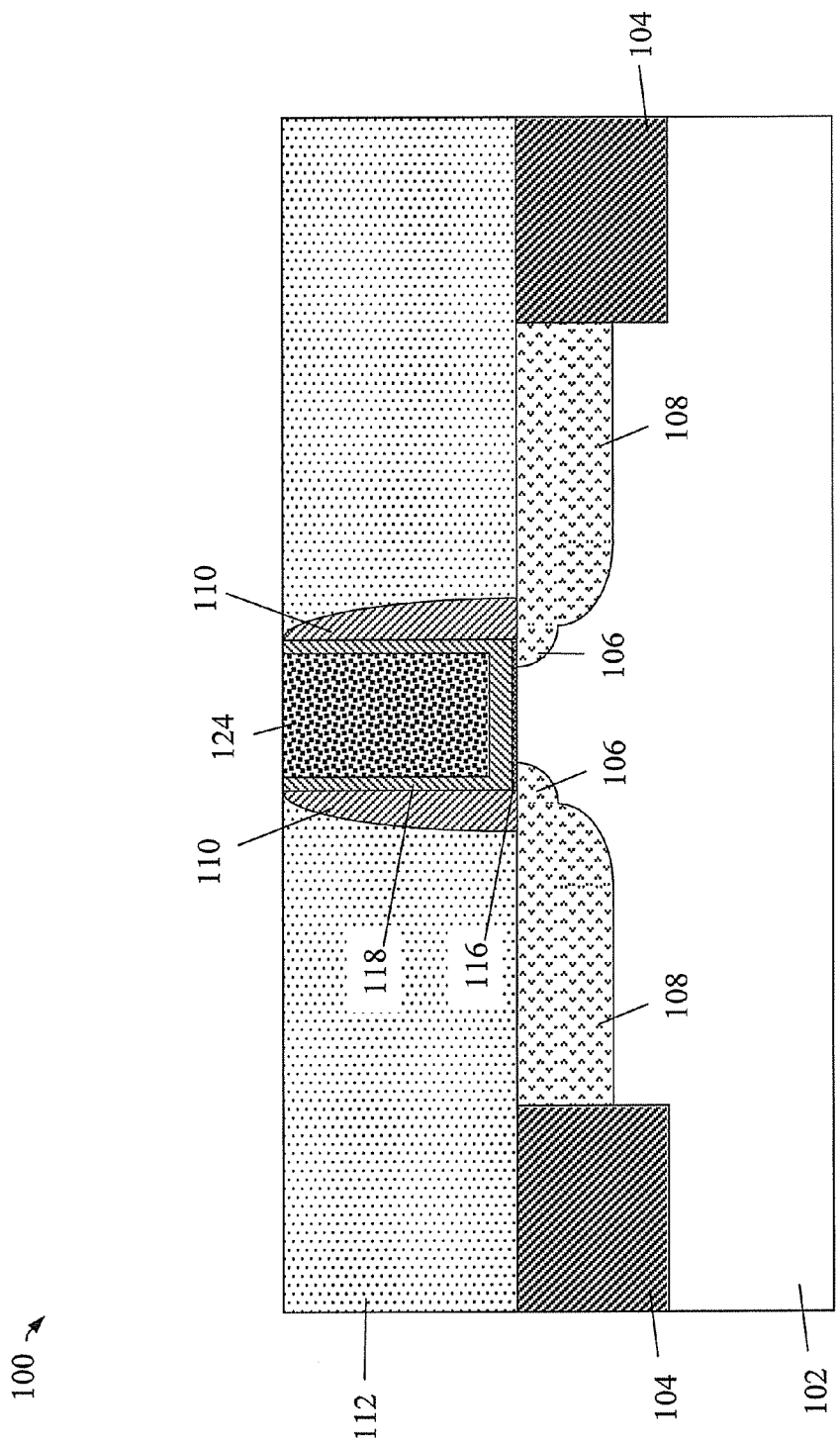

In FIG. 8, the structure is planarized, such as by chemical mechanical polishing (CMP) to define a gate last or gate replacement transistor device. From this point, existing processing techniques (e.g., silicide contact formation for gate, source and drain terminals, upper level wiring formation, etc.) may continue.

Figure 9:
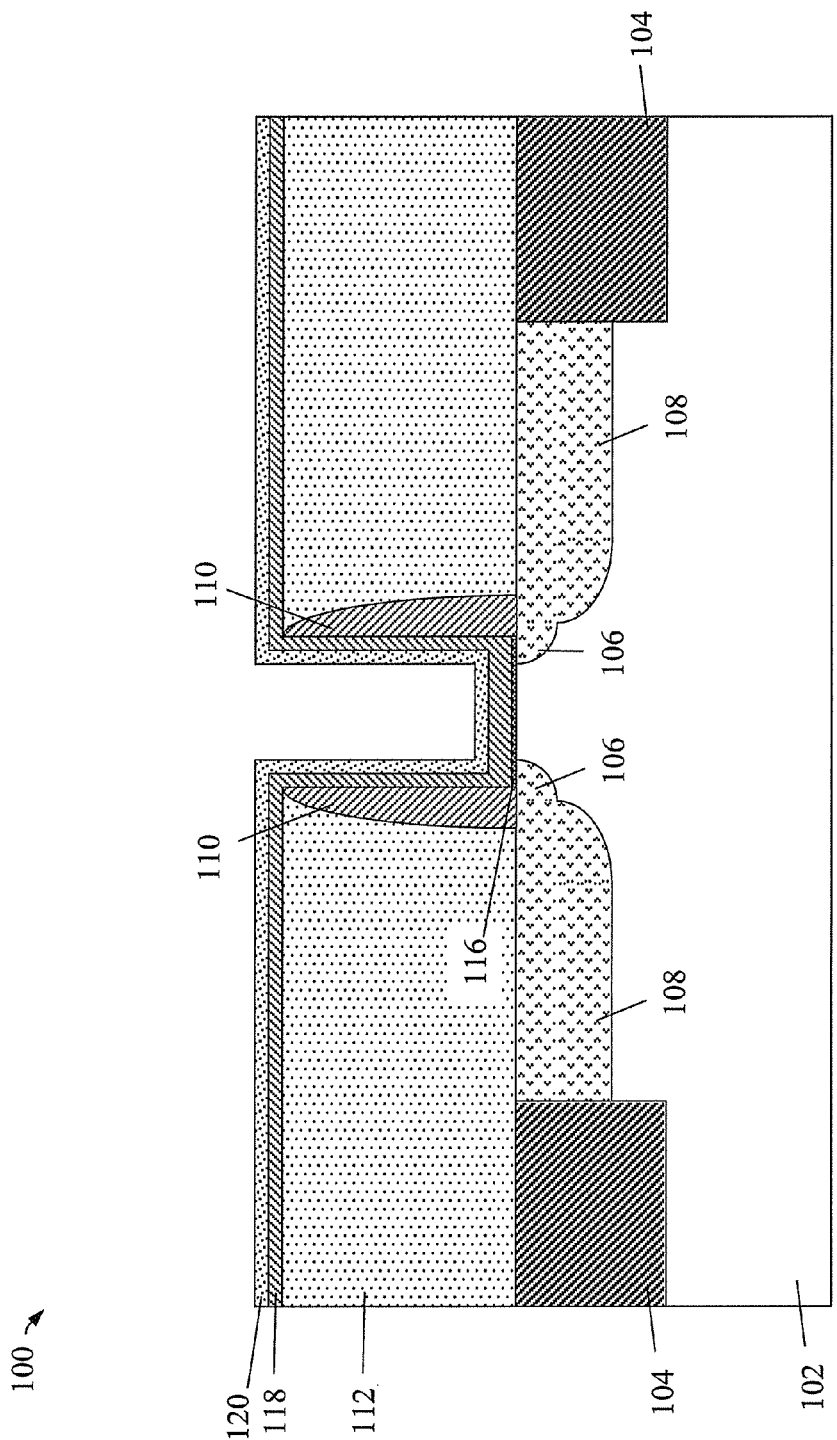
Figure 10:
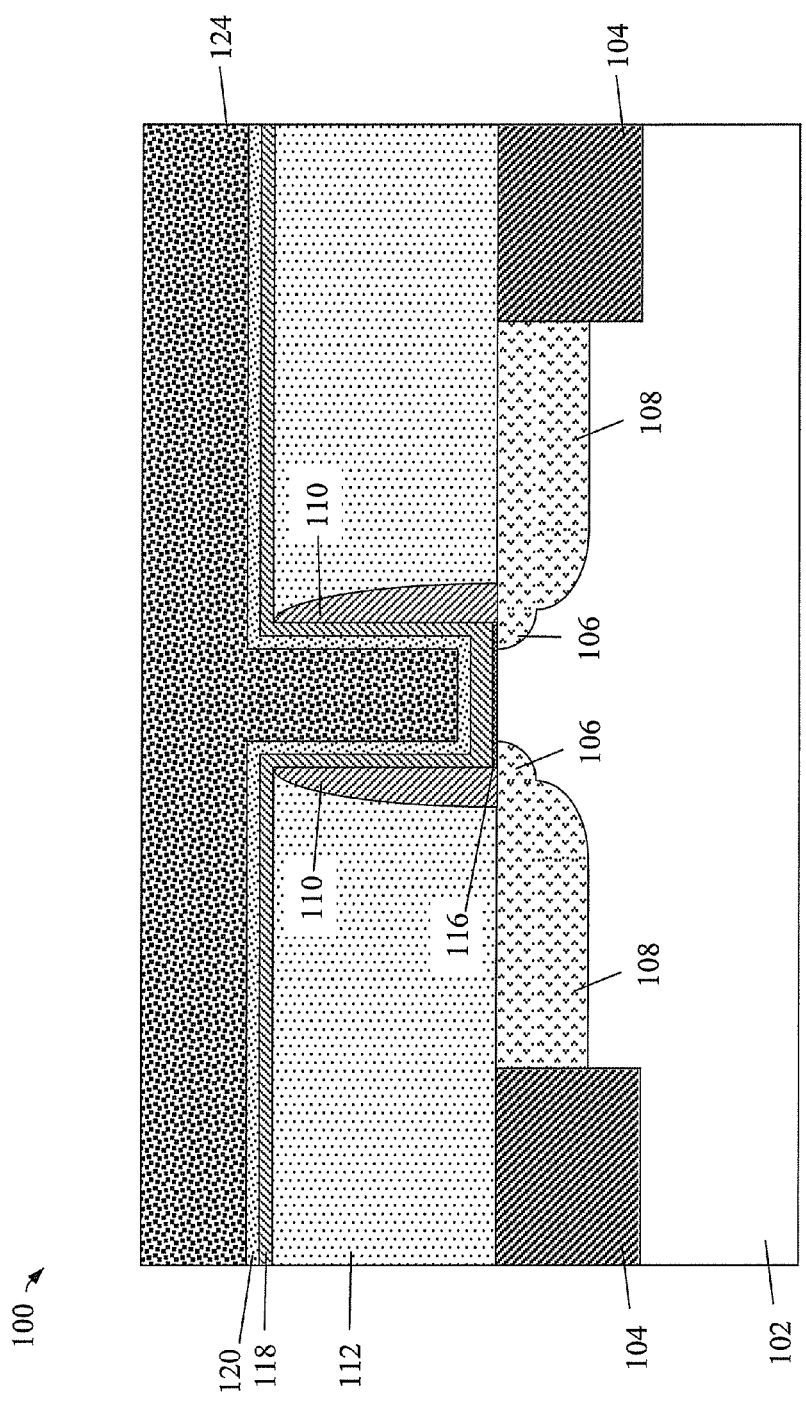
Figure 11:
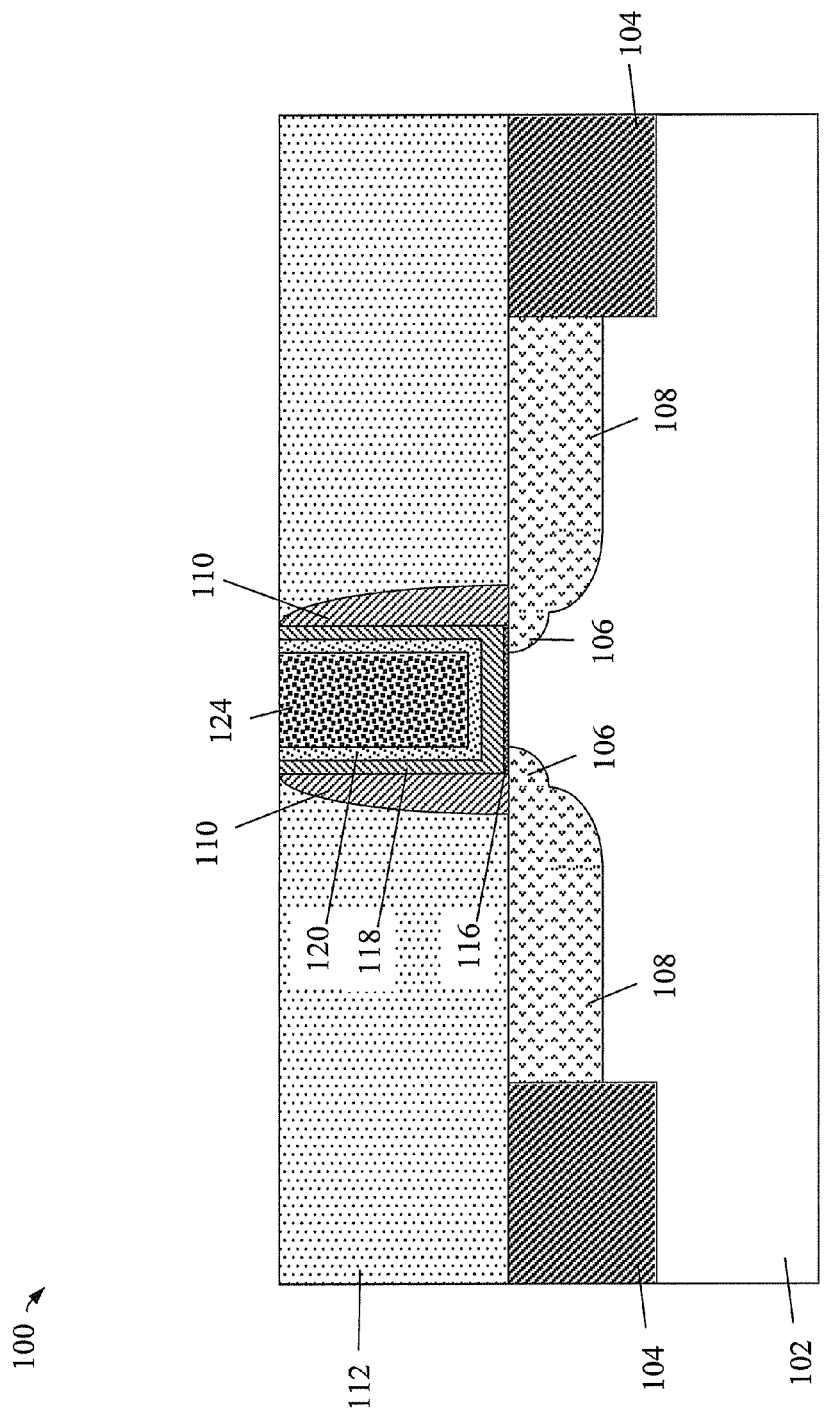

Referring briefly again to FIGS. 3 and 4, upon performing the IL scavenging by virtue of the sacrificial layer deposition at of about 500° C. to about 600° C., and following an optional RTA as shown in FIG. 4, the sacrificial layer 122 is removed. In an alternative embodiment, the doped metal layer 120 may remain in the structure after removing the sacrificial layer 122, as shown in FIG. 9. FIGS. 10 and 11 are similar to FIGS. 7 and 8 of the first embodiment, in that a metal gate material 124 is formed over the structure, followed by device planarization. Here, the doped metal layer 120 remains part of the gate electrode stack. Notably, as a result of a gate replacement scheme, both the high-k layer 118 and the doped metal layer 120 have a vertical component as well as a horizontal component in the gate stack.

Figure 12:
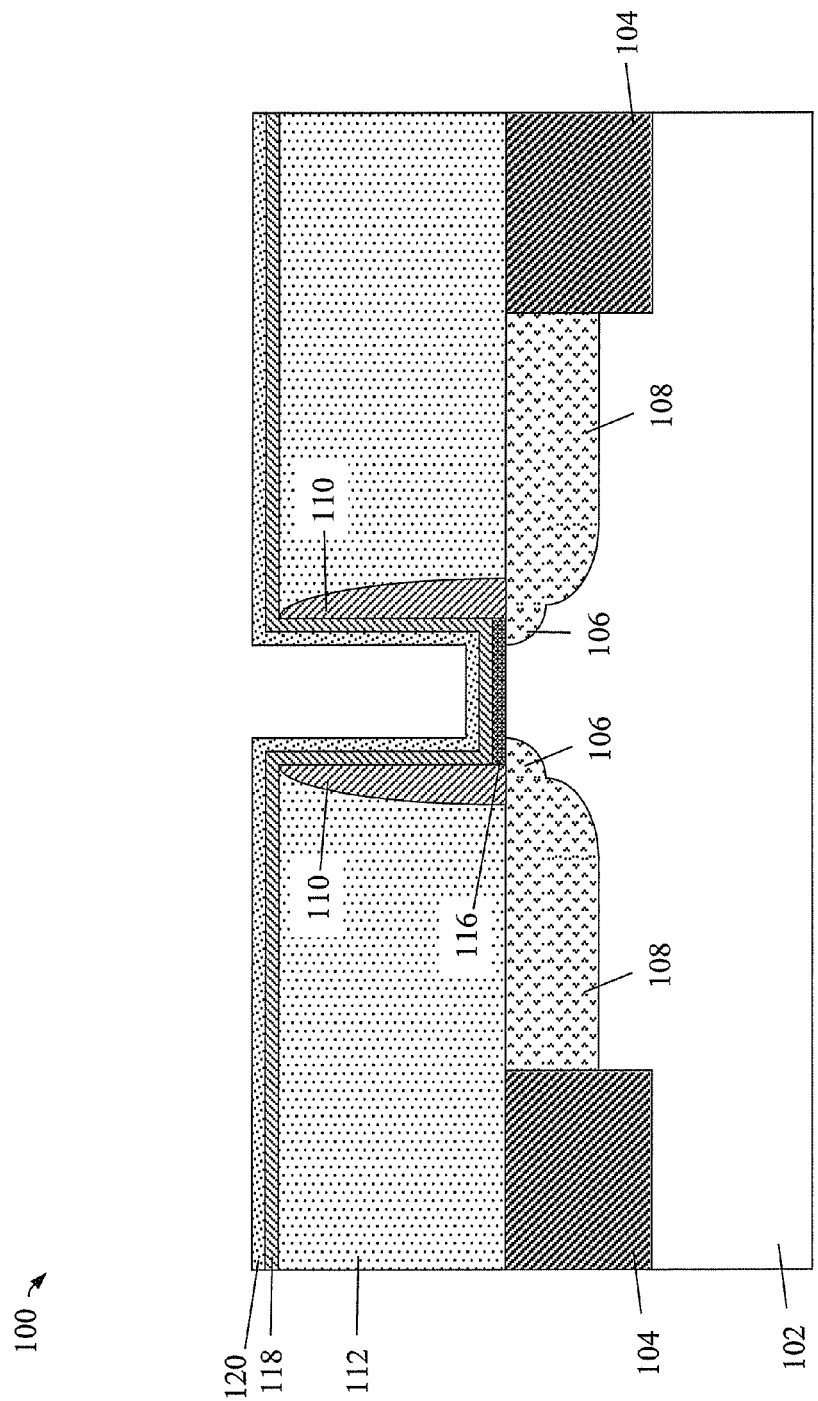
Figure 13:
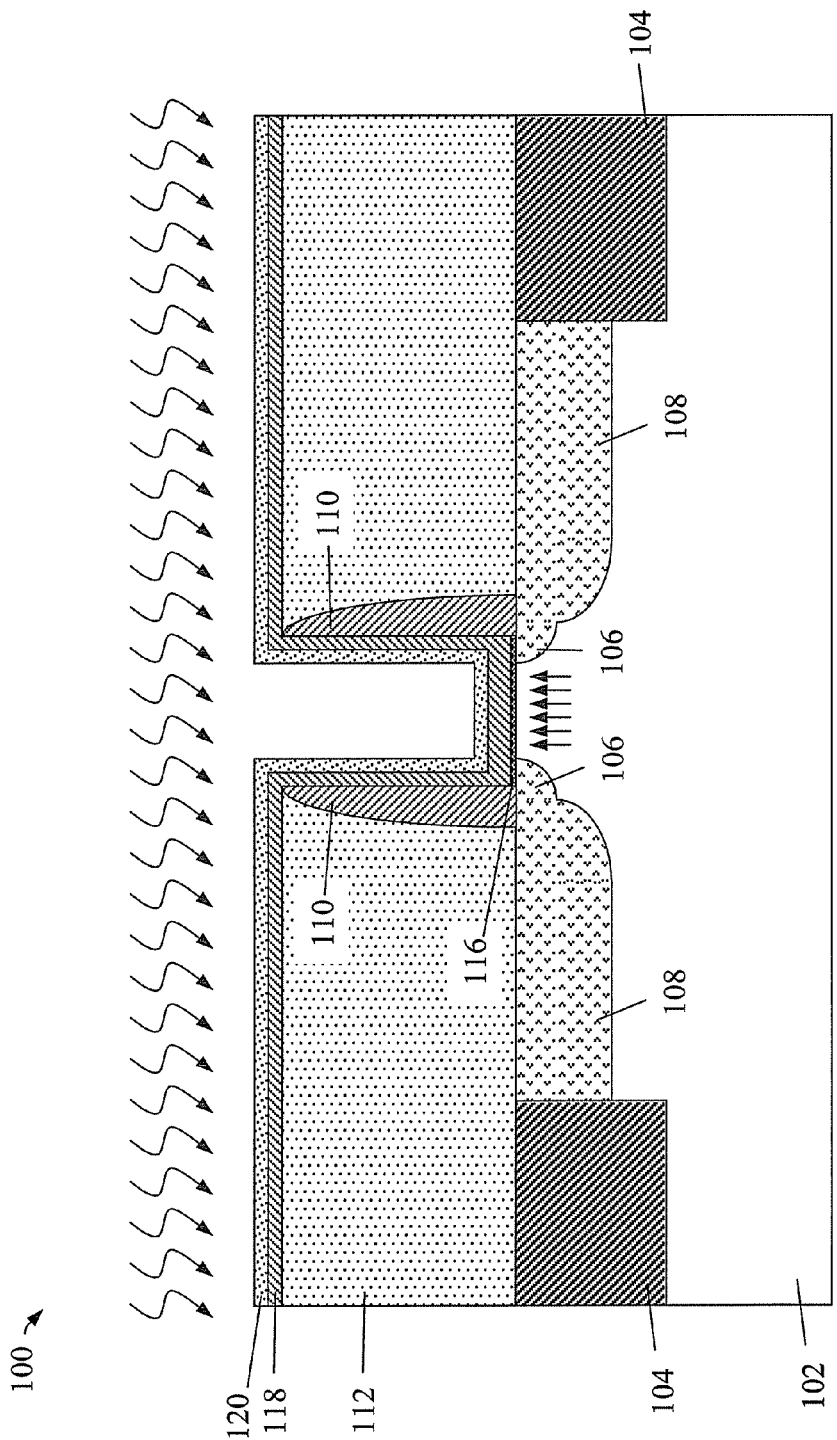

Because IL scavenging may be effectively implemented at temperatures as low as 600° C. and slightly below, other embodiments are also contemplated for performing IL scavenging in a gate replacement process flow. For example, FIG. 12 illustrates the formation the doped metal layer 120 over the high-k dielectric layer 118, in a manner similar to the embodiments discussed above. However, instead of depositing a sacrificial polysilicon layer at a scavenging inducing temperature, the device is subjected to a scavenging anneal process as indicated by the curved arrows in FIG. 13. In an exemplary embodiment, the scavenging anneal process is carried out in an $H_2$ ambient environment at a temperature range of about 400° C. to about 600° C. Once the oxygen scavenging is completed, the process may continue in accordance with FIGS. 5 through 8 as discussed above (i.e., the doped metal layer 120 is removed prior to metal gate electrode material fill), or in accordance with FIGS. 10 and 11 as discussed above (i.e., the doped metal layer 120 remains in the structure).

Regardless of the specific embodiment in which the IL 116 is scavenged in a gate replacement scheme, the final IL 116 (e.g., chemical oxide layer) has a thickness of about 5 Å or less, which results in a high-k gate dielectric structure having a $T_{inv}$ of less than about 13 Å. Moreover, such a result is seen at scavenging processing temperatures of about 600° C. or less, which is compatible with gate replacement process flows where elevated temperatures can have adverse effects on previously formed source and drain regions.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:
1. A transistor device, comprising:
an interfacial layer formed on a semiconductor substrate, corresponding to a region between doped source and drain regions in the substrate, the interfacial layer having a thickness less than about 5 angstroms (Å);
a high dielectric constant (high-k) layer formed on the interfacial layer, the high-k layer having a dielectric constant greater than about 7.5, the high-k layer having vertical sidewalls abutting vertical sidewalls of gate sidewall spacers;

a metal gate material formed over the high-k dielectric layer; and a doped metal layer formed between the high-k layer and the metal gate material, the doped metal layer having vertical sidewalls abutting the vertical sidewalls of the high-k layer, wherein the doped metal layer further comprises first and second metallic compound layers that surround a scavenging metal layer, with a material of the first and second metallic compound layers including one of a conductive transition metal nitride and a conductive transition metal carbide, and the scavenging metal layer comprising a doped metal selected such that a Gibbs free energy change of a chemical reaction, in which an atom constituting a channel combines with a metal oxide material including the doped metal and oxygen to form the doped metal in elemental form and oxide of the atom constituting a channel, is positive.

2. The device of claim 1, wherein the first and second metallic compound layers are selected from the group of TiN, TiC, TaN, TaC, and combinations thereof.

3. The device of claim 2, wherein the doped metal is selected from the group of Al, Be, Mg, Ca, Sr, Ba, Sc, Y, La, Ti, Zr, Hf, Dy, Lu, Er, Pr, and Ce, and combinations thereof.

4. The device of claim 3, wherein the metal gate material is selected from the group of Al, Ta, TaN, W, WN, Ti and TiN.

5. The device of claim 4, wherein the interfacial layer, the high-k layer, and the doped metal layer are formed between preformed gate sidewall spacers in accordance with a replacement gate scheme.

* * * * *